(12) United States Patent
Pytel et al.

(10) Patent No.: US 10,672,150 B1
(45) Date of Patent: Jun. 2, 2020

(54) SYSTEM FOR VISUALIZATION OF A BUILDING MATERIAL

(71) Applicant: CERTAINTEED CORPORATION, Malvern, PA (US)

(72) Inventors: Rachel Z. Pytel, Newton, MA (US); Gregory F. Jacobs, Oreland, PA (US); Robert L. Jenkins, Honey Brook, PA (US); Alex C. Nash, Downingtown, PA (US); Anthony Jouanin, Malvern, PA (US); Brice Dubost, Newton, MA (US); Simon Mazoyer, Paris (FR); Minas R. Apelian, Phoenixville, PA (US); Conor P. McDonald, Boston, MA (US)

(73) Assignee: CERTAINTEED CORPORATION, Malvern, PA (US)

( * ) Notice: Subject to any disclaimer, the term of this patent is extended or adjusted under 35 U.S.C. 154(b) by 0 days.

(21) Appl. No.: 16/263,106

(22) Filed: Jan. 31, 2019

Related U.S. Application Data

(63) Continuation of application No. 15/167,161, filed on May 27, 2016, now Pat. No. 10,217,242.

(60) Provisional application No. 62/211,342, filed on Aug. 28, 2015, provisional application No. 62/167,704, filed on May 28, 2015.

(51) Int. Cl.
*G06T 15/00* (2011.01)
*G06T 11/00* (2006.01)
*G06F 30/13* (2020.01)
*G06F 3/0484* (2013.01)

(52) U.S. Cl.
CPC ............ *G06T 11/001* (2013.01); *G06F 30/13* (2020.01); *G06F 3/04847* (2013.01); *G06T 2200/24* (2013.01); *G06T 2200/28* (2013.01); *G06T 2210/04* (2013.01)

(58) Field of Classification Search
CPC .............. G06T 11/001; G06T 2210/04; G06T 2200/24; G06T 2200/28; G06F 17/5004; G06F 3/04847
See application file for complete search history.

(56) References Cited

U.S. PATENT DOCUMENTS

| | | | |
|---|---|---|---|
| 4,736,253 A * | 4/1988 | Shida ................... | H04N 1/4055 358/2.1 |
| 4,970,666 A | 11/1990 | Welsh et al. | |
| 4,984,071 A * | 1/1991 | Yonezawa ............... | G06T 5/009 358/521 |

(Continued)

*Primary Examiner* — Martin Mushambo
(74) *Attorney, Agent, or Firm* — Abel Schillinger, LLP; Thomas H. Osborn

(57) ABSTRACT

A method of visualizing a building material is disclosed and includes visualizing of a building material on a color calibrated photograph of a building and providing a rendered image of the building material on the color calibrated photograph of the building. The rendered image has a color accuracy, ΔE, as measured according to a Color Test, of less than 10. Further, the rendered image has a shadow accuracy as measured according to a Shadowing Test, of at least 75%. The Shadowing Test compares a shadow fidelity of the rendered image to the color calibrated photograph at least partially based on luminance angle and intensity and one or more rendered shadows are measured for accuracy of size and luminance.

20 Claims, 5 Drawing Sheets

(56) References Cited

U.S. PATENT DOCUMENTS

| | | | | |
|---|---|---|---|---|
| 5,175,807 A * | 12/1992 | Cawley | G06F 3/04845 | 345/428 |
| 5,537,638 A * | 7/1996 | Morita | G06T 15/04 | 345/426 |
| 5,553,859 A * | 9/1996 | Kelly | A63B 67/02 | 273/338 |
| 5,572,635 A * | 11/1996 | Takizawa | G06T 15/50 | 345/426 |
| 5,582,961 A * | 12/1996 | Giorgianni | G03C 5/02 | 430/502 |
| 5,609,978 A * | 3/1997 | Giorgianni | G03C 7/3041 | 358/505 |
| 5,694,533 A | 12/1997 | Richards et al. | | |
| 5,821,917 A * | 10/1998 | Cappels | H04N 9/645 | 345/589 |
| 6,313,823 B1 * | 11/2001 | Cappels | G09G 1/165 | 345/589 |
| 6,320,578 B1 * | 11/2001 | Shiitani | G06T 15/60 | 345/419 |
| 6,339,429 B1 | 1/2002 | Schug | | |
| 6,744,441 B2 * | 6/2004 | Wu | G03B 35/00 | 345/582 |
| 6,891,980 B2 * | 5/2005 | Gerhard | G01N 21/455 | 382/312 |
| 7,068,274 B2 | 6/2006 | Welch et al. | | |
| 7,102,648 B1 * | 9/2006 | Holub | G06F 3/14 | 345/589 |
| 7,515,160 B2 * | 4/2009 | Kerofsky | G09G 3/2007 | 345/581 |
| 7,668,334 B2 * | 2/2010 | Reed | G06T 1/005 | 358/3.26 |
| 7,728,833 B2 | 6/2010 | Verma et al. | | |
| 7,728,845 B2 * | 6/2010 | Holub | G01J 3/02 | 345/589 |
| 7,973,796 B1 * | 7/2011 | Marston | G06T 11/60 | 345/581 |
| 8,077,353 B2 * | 12/2011 | Wada | H04N 1/6058 | 345/601 |
| 8,339,394 B1 | 12/2012 | Lininger | | |
| 8,427,473 B2 | 4/2013 | Elsberg et al. | | |
| 8,564,607 B2 * | 10/2013 | Lee | G06T 11/001 | 345/582 |
| 8,749,580 B1 * | 6/2014 | Lininger | G11B 27/322 | 345/629 |
| 8,872,811 B1 * | 10/2014 | Rump | G06F 17/5009 | 345/418 |
| 2002/0154814 A1 * | 10/2002 | Gerhard | G01N 21/455 | 382/181 |
| 2003/0007700 A1 * | 1/2003 | Gutta | G06T 17/00 | 382/282 |
| 2003/0063084 A1 * | 4/2003 | Burke | G06T 9/001 | 345/419 |
| 2003/0122843 A1 * | 7/2003 | Lai | H04N 1/46 | 345/589 |
| 2003/0179915 A1 * | 9/2003 | Goto | A61B 6/463 | 382/128 |
| 2004/0012542 A1 * | 1/2004 | Bowsher | G06T 15/00 | 345/10 |
| 2004/0076315 A1 * | 4/2004 | Scoll | G06T 7/0012 | 382/128 |
| 2005/0074179 A1 | 4/2005 | Wilensky | | |
| 2005/0134918 A1 * | 6/2005 | Reed | H04N 1/4078 | 358/3.01 |
| 2005/0141754 A1 * | 6/2005 | Lo | G06K 9/00087 | 382/124 |
| 2005/0243336 A1 * | 11/2005 | Kuhn | H04N 1/6033 | 358/1.9 |
| 2005/0259034 A1 * | 11/2005 | Harada | G02B 27/0101 | 345/7 |
| 2006/0232792 A1 * | 10/2006 | Kobayashi | G06F 3/0416 | 356/621 |
| 2006/0282769 A1 | 12/2006 | Bronstein | | |
| 2007/0035755 A1 * | 2/2007 | Maki | H04N 1/00384 | 358/1.9 |
| 2007/0216709 A1 * | 9/2007 | Kojima | G06F 3/1415 | 345/619 |
| 2008/0158142 A1 * | 7/2008 | Zhou | G09G 3/344 | 345/107 |
| 2009/0141966 A1 * | 6/2009 | Chen | G06T 19/006 | 382/154 |
| 2010/0060943 A1 * | 3/2010 | Monga | G06K 1/121 | 358/3.28 |
| 2010/0097407 A1 * | 4/2010 | Zulch | G01J 3/504 | 345/690 |
| 2010/0123648 A1 | 5/2010 | Miller | | |
| 2010/0123651 A1 | 5/2010 | Miller | | |
| 2010/0241406 A1 * | 9/2010 | Rahmes | G06F 17/5004 | 703/1 |
| 2010/0253684 A1 * | 10/2010 | Yang | G06T 11/001 | 345/426 |
| 2011/0002529 A1 * | 1/2011 | Jeong | G01B 11/25 | 382/147 |
| 2011/0141497 A1 * | 6/2011 | Willamowski | H04N 1/00408 | 358/1.9 |
| 2011/0243587 A1 | 10/2011 | No | | |
| 2012/0013635 A1 * | 1/2012 | Beeman | G09G 3/2003 | 345/590 |
| 2012/0019493 A1 * | 1/2012 | Barnhoefer | H05B 33/0851 | 345/207 |
| 2012/0050307 A1 * | 3/2012 | Mahowald | H05B 37/0218 | 345/590 |
| 2012/0056911 A1 * | 3/2012 | Safaee-Rad | G09G 3/2003 | 345/690 |
| 2012/0063680 A1 * | 3/2012 | Daisy | G06T 15/205 | 382/165 |
| 2012/0179431 A1 | 7/2012 | Labrie et al. | | |
| 2012/0197600 A1 | 8/2012 | Bai | | |
| 2012/0243008 A1 * | 9/2012 | Chatow | G06F 3/1229 | 358/1.9 |
| 2012/0249536 A1 * | 10/2012 | Sutou | G06T 7/85 | 345/419 |
| 2013/0127847 A1 * | 5/2013 | Jin | G06T 17/20 | 345/420 |
| 2013/0155119 A1 * | 6/2013 | Dai | G09G 3/3406 | 345/690 |
| 2013/0314410 A1 | 11/2013 | Gravois | | |
| 2013/0328871 A1 | 12/2013 | Piemonte | | |
| 2013/0343603 A1 * | 12/2013 | Choi | G06T 5/005 | 382/103 |
| 2014/0043321 A1 * | 2/2014 | Matjasko | G06T 15/00 | 345/419 |
| 2014/0092068 A1 * | 4/2014 | Zheng | G06F 3/0304 | 345/175 |
| 2014/0210802 A1 * | 7/2014 | Myers | G09G 3/3413 | 345/207 |
| 2014/0240477 A1 | 8/2014 | Feng | | |
| 2014/0320488 A1 * | 10/2014 | Ege | G06T 17/05 | 345/420 |
| 2015/0054846 A1 * | 2/2015 | Okada | G09G 5/10 | 345/589 |
| 2015/0125047 A1 | 5/2015 | Ikenoue | | |
| 2015/0254889 A1 * | 9/2015 | Bakalash | G06F 9/5061 | 345/426 |
| 2015/0324989 A1 * | 11/2015 | Smith | G06T 7/00 | 382/278 |
| 2015/0348314 A1 | 12/2015 | Koguchi | | |
| 2016/0062956 A1 * | 3/2016 | Gotman | G06F 19/321 | 715/243 |
| 2016/0127630 A1 | 5/2016 | Kitajima | | |
| 2016/0210087 A1 * | 7/2016 | Amir | G06F 3/1217 | |
| 2016/0352976 A1 * | 12/2016 | Kuroiwa | H04N 1/6027 | |
| 2017/0148161 A1 * | 5/2017 | Griffin | A61B 5/0066 | |

\* cited by examiner

FIG. 6

SYSTEM FOR VISUALIZATION OF A BUILDING MATERIAL

CROSS-REFERENCE TO RELATED APPLICATION(S)

This application is a continuation of and claims priority under 35 U.S.C. § 120 to U.S. patent application Ser. No. 15/167,161 entitled "System for Visualization of a Building Material," by Rachel Z. Pytel, Gregory F. Jacobs, Robert L. Jenkins, Alex C. Nash, Anthony Jouanin, Brice Dubost, Simon Mazoyer, Minas R. Apelian and Conor Patrick McDonald, filed May 27, 2016, which claims priority under 35 U.S.C. § 119(e) to U.S. Patent Application No. 62/211,342 entitled "System for Visualization of a Building Material," by Rachel Z. Pytel, Gregory F. Jacobs, Robert L. Jenkins, Alex C. Nash, Anthony Jouanin, Brice Dubost, Simon Mazoyer and Minas R. Apelian, filed Aug. 28, 2015 and claims priority under 35 U.S.C. § 119(e) to U.S. Patent Application No. 62/167,704 entitled "System for Visualization of a Building Material," by Rachel Z. Pytel, Gregory F. Jacobs, Robert L. Jenkins, Alex C. Nash, Anthony Jouanin, Brice Dubost, Simon Mazoyer, Minas R. Apelian and Conor Patrick McDonald, filed May 28, 2015, of which all applications are assigned to the current assignee hereof and incorporated herein by reference in their entireties.

FIELD OF THE DISCLOSURE

The present disclosure relates to a system for visualization of a building material.

RELATED ART

As the cost of building materials continues to increase, consumers are demanding ways to improve visualization of building materials prior to purchase. Traditionally, when selecting a building material (e.g., shingles, siding, decking), a customer may order one or more samples which may be in the form of a sample board or an individual tile or cutout so that the sample may be put near the location of final installation for inspection. Preparation and shipment of these samples takes time and costs money.

It is only through on-site physical examination that the customer can accurately determine whether the material of the sample is acceptable. Attempts to replicate the building material's in-use appearance, as affected for example by lighting intensity, angle, and coloration, with a non-realistic sample generally fail as the actual material often appears different upon final installation.

The industry continues to demand a more cost effective system whereby a customer can accurately view a building material in various lighting conditions without requiring physical delivery of a sample.

BRIEF DESCRIPTION OF THE DRAWINGS

Embodiments are illustrated by way of example and are not intended to be limited in the accompanying figures.

FIG. 6 includes an illustration of a building material database in accordance with an embodiment and parameters associated with the respective building materials.

Figure 1:
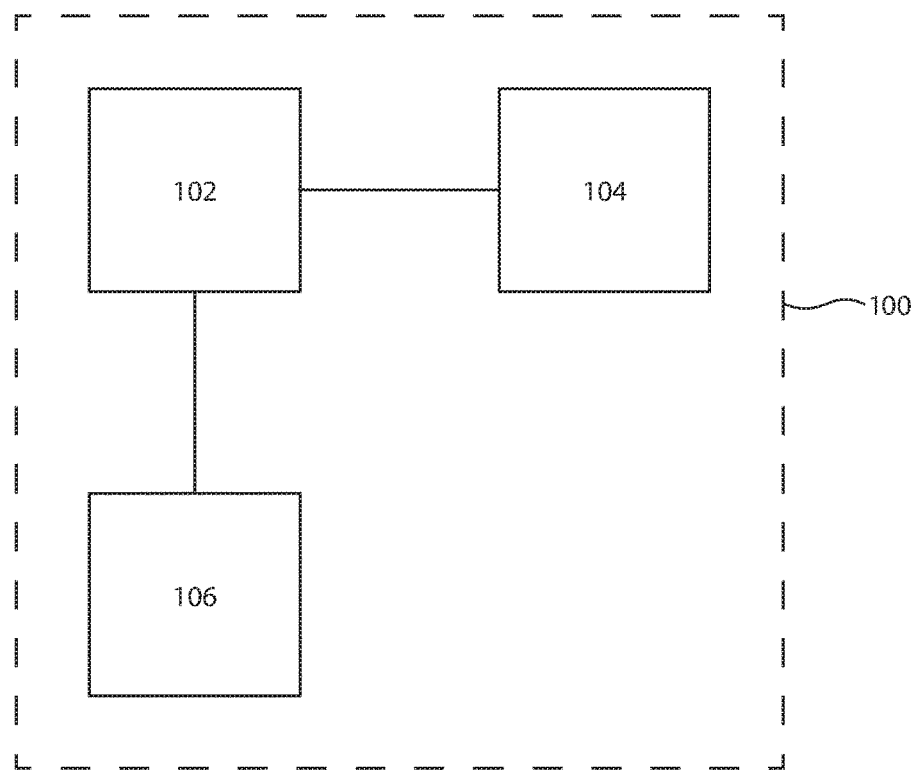
FIG. 1 includes a diagram of a system in accordance with an embodiment.

Skilled artisans appreciate that elements in the figures are illustrated for simplicity and clarity and have not necessarily been drawn to scale. For example, the dimensions of some of the elements in the figures may be exaggerated relative to other elements to help to improve understanding of embodiments of the invention.

DETAILED DESCRIPTION

The following description in combination with the figures is provided to assist in understanding the teachings disclosed herein. The following discussion will focus on specific implementations and embodiments of the teachings. This focus is provided to assist in describing the teachings and should not be interpreted as a limitation on the scope or applicability of the teachings. However, other embodiments can be used based on the teachings as disclosed in this application.

The terms "comprises," "comprising," "includes," "including," "has," "having" or any other variation thereof, are intended to cover a non-exclusive inclusion. For example, a method, article, or apparatus that comprises a list of features is not necessarily limited only to those features but may include other features not expressly listed or inherent to such method, article, or apparatus. Further, unless expressly stated to the contrary, "or" refers to an inclusive-or and not to an exclusive-or. For example, a condition A or B is satisfied by any one of the following: A is true (or present) and B is false (or not present), A is false (or not present) and B is true (or present), and both A and B are true (or present).

Also, the use of "a" or "an" is employed to describe elements and components described herein. This is done merely for convenience and to give a general sense of the scope of the invention. This description should be read to include one, at least one, or the singular as also including the plural, or vice versa, unless it is clear that it is meant otherwise. For example, when a single item is described herein, more than one item may be used in place of a single item. Similarly, where more than one item is described herein, a single item may be substituted for that more than one item.

Unless otherwise defined, all technical and scientific terms used herein have the same meaning as commonly understood by one of ordinary skill in the art to which this invention belongs. The materials, methods, and examples are illustrative only and not intended to be limiting. When a listing of individual members of a group is used herein, all individual members of the group and all combinations and subcombinations possible of the group are intended to be individually included in the disclosure. To the extent not described herein, many details regarding specific materials and processing acts are conventional and may be found in textbooks and other sources within the digital visualization arts.

According to one or more embodiments described herein, a system for rendering a building material can generally include a database having an adjustable parameter relating to a characteristic of a contemplated building material. The system may be adapted to provide a rendered image of the contemplated building material where the rendering has a ΔE, as measured according to a Color Test (described below) with respect to the contemplated building material having parameters associated with the adjustable parameters, of less than 10. In an embodiment, the ΔE may be less than 8, less than 6, less than 5, less than 4, less than 3, less than 2, or less than 1.

According to one or more embodiments described herein, a system for rendering a building material can generally include a database having an adjustable parameter relating to a characteristic of a contemplated building material. The system may be adapted to provide a rendered image of the contemplated building material where the rendering has a shadow accuracy, as measured according to a Shadowing Test (described below) with respect to the contemplated building material having parameters associated with the adjustable parameters, of at least 75%. In an embodiment, the shadow accuracy may be at least 80%, at least 90%, or even at least 95%.

As illustrated in FIG. 1, a system 100 for visualizing a building material can generally include a logic element 102 operatively coupled to a user interface 104. As used herein, a "building material" refers to a material which may become part of a structure. Exemplary building materials include roofing, siding, fencing, railing, decking, flooring, ceiling material, wall material, and other similar materials. The building material may be an interior material, such as wall covering, ceiling treatments, blinds, molding, or shelving, disposed within the building. The building material may also be exterior material, such as stucco, siding, or decking disposed on the outside, or at least partially along the outside, of the building. As used herein, a "building" refers to both permanent and temporary structures, including single story buildings, multiple story buildings, apartments, offices, detached structures (e.g., detached garages, sheds, carports, arbors), mobile buildings, fencing, decking, railing, or any other similar structure which may permanently or temporarily occupy an area of land. As used herein, "operatively coupled" refers to a configuration of elements such as device components, wherein an action or reaction of one element may affect another element, but in a manner that preserves each element's functionality. For example, operatively coupled components may be in contact, such as in electrical contact by a signal-conductive wire or a wireless communication protocol such that a signal is output from a first component and wirelessly received by a second component. Operatively coupled components may be coupled directly together, i.e., a signal generated by a first component transmits directly to the second component, or by one or more intervening components, such as relays, wireless communication devices, or other suitable, intervening components.

In one embodiment, the logic element 102 can have access to one or more calibrated photographs of the building onto which the building material is to be rendered. A "photograph" as used herein generally includes an image of a real object photographed by a digital photographic apparatus, that is, photographs or moving pictures. A "photograph" can further include an image of the real object as photographed by a film camera, for example on photographic film, and transferred to a digitally accessible format. A "photograph" may also include an accurate rendering of the real object in a digitally accessible format. A "calibrated photograph" as used herein refers to a photograph calibrated with standard targets of accuracy, such as for example, standard color targets (e.g., X-rite Color Checker). For instance, when photographing a uniform lambertian reflector having uniform light distribution with a homogenous luminance, the resulting calibrated photograph (either taken directly or after being subjected to computational correction) has a lightness value of each pixel within a range of no greater than ±10% as compared to a mean lightness value of the overall photograph. In a further embodiment, each pixel can have a lightness value within a range of no greater than ±9%, ±8%, ±7%, ±6%, ±5%, ±4%, ±3%, ±2%, or ±1%. In certain embodiments, the photograph can have a calibrated color value for each pixel within a range of no greater than 10 ΔE as compared to the color of the reference object (measured with a calibrated colorimeter), the reference object having a color within the gamut of the sRGB color space. In a further embodiment, each pixel can have a color value within a range of no greater than 9 ΔE, 8 ΔE, 7 ΔE, 6 ΔE, 5 ΔE, 4 ΔE, 3 ΔE, 2 ΔE, or 1 ΔE as compared to the color value of the reference object. Use of a calibrated photograph may be particularly important in embodiments where the building material is rendered over a large area of the photograph (e.g., the building material occupies at least 50% of the photograph) as deviations from calibration, such as deviations which may occur around the edges of uncalibrated photographs, may skew, or alter, the rendered image. Calibration of the photograph can occur, for example, by the digital photographic apparatus at or around the time of capturing the photograph, or at a later time by computational software (e.g., post-processing).

In a particular instance, the raw photograph taken by the digital photographic apparatus can be subjected to one or more post-processing steps after capture. Traditional photographic apparatuses often produce less-than faithful images of the scene being captured. Unprocessed images can appear soft, dull, or unsaturated to the viewer. Post-processing can correct the raw, captured image to have a high fidelity to the captured scene.

The one or more post-processing steps can occur, for example, on a logic element, such as a computer. Exemplary post-processing operations include adjustment of at least one of exposure, white balance, sharpness, noise, contrast, or any other readily known post-processing operation. The final, post-processed image can be referred to as a "post-processed, calibrated photograph."

In an embodiment, each photograph can include metadata, such as positional information (e.g., geotagging, positional arrangement) or directional information (e.g., angular position with respect to the sun, azimuth and viewing angles), which can be included, for example, as an exchangeable image file format (EXIF) and may be stored in an image or an independent file type. In a particular embodiment, the metadata may include geographic coordinate system identification, such as latitude or longitude of the location where the photograph was taken. In a further embodiment, the metadata may specify the date or time of day the photograph was taken. The system 100 may utilize the geographic coordinate system identification and date to retrieve average or actual conditions at the time the photograph was captured at the location of capture. That is, the system 100 may simulate the conditions at the location at the time the photograph was captured. "Average" conditions refer to average environmental and luminance conditions at the latitude and longitude of the photograph, for the given date and time of capture. "Actual" conditions may be taken from historical records and may reflect the actual environmental and luminance conditions at the location and time the photograph was captured.

In an embodiment, photographs of the building may be any one of perspective, elevation, isometric, or orthogonal views. In another embodiment, at least one of the photographs may be of a non-traditional view of the building, such as an angular view from a non predefined location and angle. In a particular embodiment, the logic element 102 may receive a description of the view presented in the photograph (i.e., is the photograph a perspective view or a non-traditional view). Entrance of the description or similar directional information may facilitate or enhance rendering quality by better permitting proper alignment and orientation of the building material with respect to the building.

Figure 2:
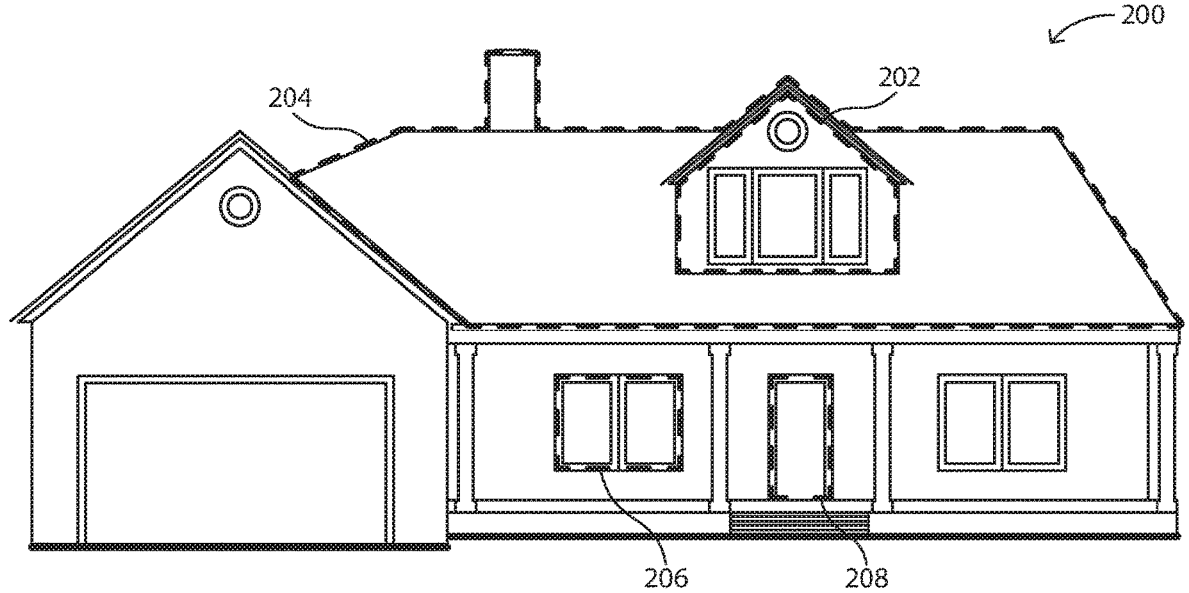
FIG. 2 includes an illustration of an embodiment of a photograph with masking.

FIG. 2 includes an exemplary photograph of a building as might be accessed by the logic element 102. In certain embodiments, the photograph may include digital masking defining discrete surfaces and features within the photograph. For example, digital masking may divide a house 200 into wall surfaces 202, roof surfaces 204, window surfaces 206, door surfaces 208, or any other recognizable surface. The wall surfaces 202, for example, may further be categorized by relative location along the house, e.g., first story, second story, or third story. The digital masking may allow for discrete selection of one surface, or even one relative location, of the house 200 to permit selective augmentation or adjustment of that surface, independent of the other remaining surfaces. In one particular instance, the digital masking may be visible to a user, such as for example, by inclusion of outlines around each masked surface. In another instance, digital masking may be hidden, whereby a user cannot actively see demarcation or delineation of the different surfaces. In certain embodiments, digital masking can be automatically generated, for example, by a computational device such as a computer. Automatic digital masking can define the surfaces using a formula or other logic operating analysis. In other embodiments, digital masking may be human generated. That is, a human may select or outline one or more surfaces for masking. In an embodiment, human generated masking may involve computational logic. For example, a human can manually select a particular surface of the building whereupon the computational logic automatically outlines the surface. In another example, a human can geometrically select an area or a portion of an area that delineates a surface comprising a particular building material. In an embodiment, the digital masking may be user adjustable. That is, the user may select the masking and manually adjust one or more portions thereof. For example, a user may distinguish a wall surface 202 into multiple wall surfaces, thereby allowing the wall surface to include, for example, multiple building materials therealong. Alternatively, the user may correct for any problems or misalignment of the digital masking with respect to the house 200.

In an embodiment, digital masking can include automatic detection of surfaces of the image to be masked. Exemplary masking techniques can rely on texture classification techniques, color segmentation, or a combination thereof. Perspective detection can detect relative angles of objects in the image. For example, the pitch of a roof, the angle of a house wall, and other similar surface angles can be detected, thereby permitting refined masking and overlay. Perspective detection can include canny edges and Hough transform and perspective retrieval like exterior orientation using coplanar parallel lines. Information related to the perspective of the objects in the image can be processed to determine the relative angle and orientation of elements being masked in the image. In turn, the rendering can be done such that the elements rendered onto surfaces are rendered at the correct angles, orientations, sizes, or any combination thereof.

Referring again to FIG. 1, in an embodiment, the logic element 102 and user interface 104 may be connected together by one or more non-wireless communication systems. For example, the logic element 102 and user interface 104 may be connected together by a LAN network, or directly connected together through physical wiring. In another embodiment, the logic element 102 may be connected to the user interface 104 by one or more wireless communication systems as one or more data streams over a network or other wireless signal. For example, in a particular embodiment, a satellite communication element can relay a signal between the logic element 102 and the user interface 104. Transfer formats and protocols are generally known in the art, and may additionally include web services over HTTP or HTTPS protocols.

In a particular instance, the logic element 102 and user interface 104 may be distributed across multiple computer systems, such as where the logic element 102 is stored in a server cluster and the user interface 104 is part of a mobile device, such as a tablet, computer, or mobile telephone. In another instance, the logic element 102 and user interface 104 may be part of, or generally in, a single machine such as a desktop computer, workstation, mainframe, server, laptop computer, or other similar computer system. For example, the logic element 102 and user interface 104 may both be integrated in a personal computer where the logic element 102 includes one or more central processing units (CPU), such as microprocessors or microcontrollers, and the user interface 104 is an electronic visual display, such as for example, a liquid crystal display (LCD), a light-emitting diode (LED) display, or organic light-emitting diode (OLED) display, a plasma display, a CRT display, or another type of display or visual monitor.

In an embodiment, the system 100 can further include a storage element 106 such as a magnetic data storage system, an optical system, a FLASH system, or any suitable data storage system. The storage element 106 may be in communication with the logic element 102, for example, via any one of the protocols discussed above. In a particular instance, the storage element 106 and logic element 102 may be distributed across multiple computer systems and can communicate through a wired or wireless protocol. In another instance, the storage element 106 and logic element 102 may be part of, or generally in, a single machine. The storage element 106 may store one or more photographs, such as calibrated photographs, which may be accessible by the logic element 102 during system operation. As discussed in greater detail below, during system operations, the logic element 102 may access one or more of the photographs, or calibrated photographs, stored in the storage element 106 in order to render a building material thereon.

The process of visualizing a contemplated building material in accordance with embodiments described herein can generally include entering or adjusting an adjustable parameter and rendering an image of the contemplated building material having the attribute(s) associated with the adjustable parameter. As used herein, a "contemplated building material" refers to a building material contemplated by a user. In a particular embodiment, the contemplated building material may not yet be commercially available for sale. In a particular instance, the contemplated building material may include an already known building material with a different attribute. That is, a user may want to modify a commercially available building material to have one or more different attributes than the commercially available version.

Figure 3:
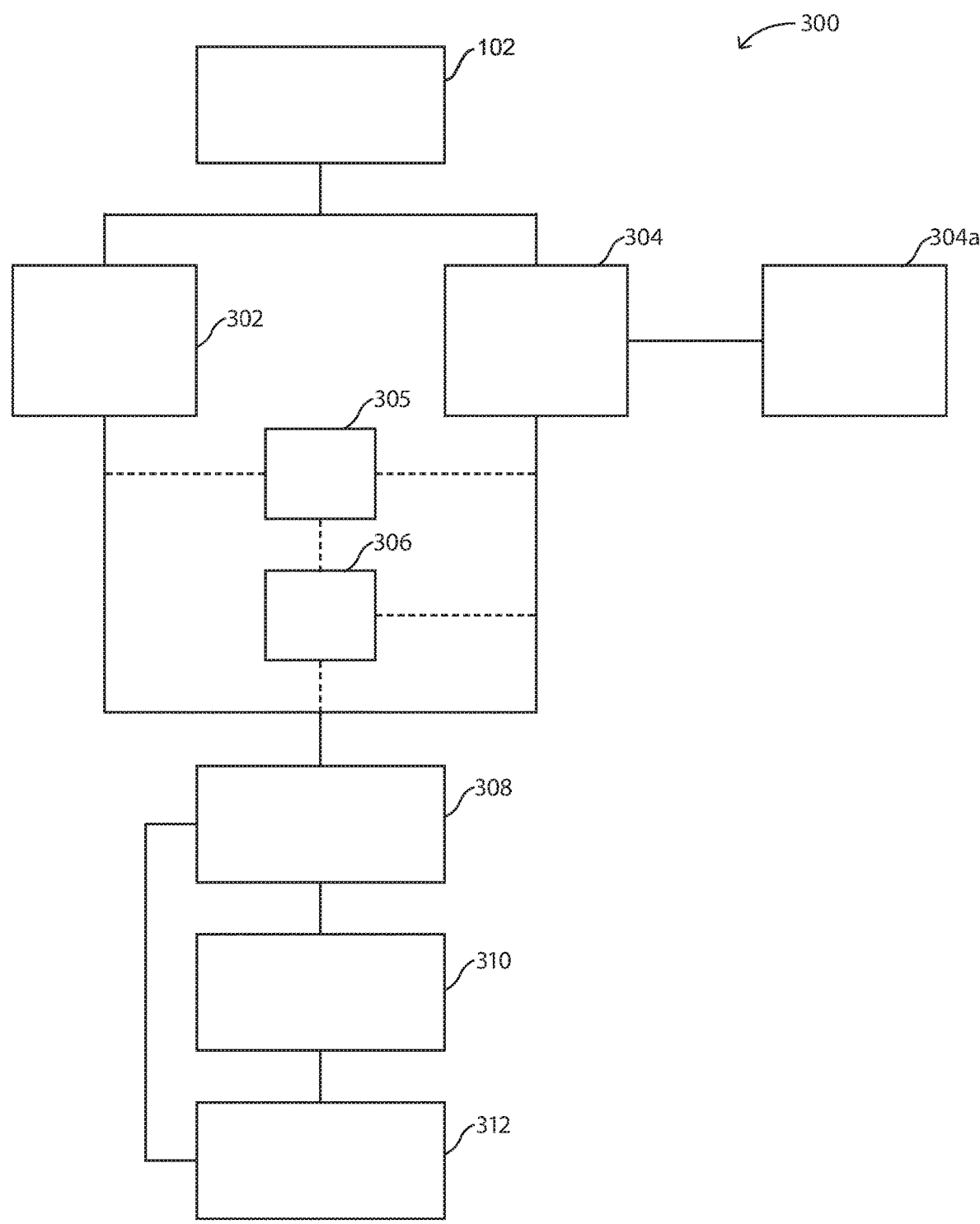
FIG. 3 includes a flowchart of one embodiment for rendering a building material onto a building for visual inspection.

FIG. 3 includes a flowchart of an embodiment of a process 300 for visualizing the contemplated building material. The process 300 may begin when a user selects 302 a type of building material to be visualized. As described above, exemplary building materials include roofing, siding, fencing, railing, decking, flooring, ceiling material, wall material, blinds, molding, shelving, stucco, mortars, renders, siding, glass panels, decking, masonry, and synthetic or simulated masonry.

In a particular instance, selection 302 of the type of building material may be performed using a selectable grouping where a user may pick from a list of possible building materials. "List" refers to a grouping of at least 2 options, at least 3 options, at least 4 options, at least 5 options, at least 10 options, at least 20 options, at least 30 options, at least 40 options, at least 50 options, at least 60 options, at least 70 options, at least 80 options, at least 90 options, or at least 100 options. The available building materials in the list may be categorized, such as for example, into types of materials (wood, stucco, vinyl, etc.) and further sub-categorized (e.g., dark wood or light wood, stained wood or painted wood, coarse wood or finely-finished wood) for user convenience. In an embodiment, the user may further review the available building materials via representative images whereby the user can see a small photograph or rendering of each of the building materials.

In an embodiment, and as discussed in greater detail below, the user may optionally generate and select a new, custom designed building material for rendering on the building (block 304a). In a particular instance, information relating to the new, custom designed building material may be first added to the list of available building materials prior to selection thereof. In another instance, information relating to the new, custom designed building material may not be added to the list of available building materials prior to selection, and may instead by transmitted directly to the logic element 102.

In an embodiment, the user may select one or more masked surfaces of the building onto which viewing of the building material is desired (block 305). In another particular embodiment, the user may otherwise manually define a region of the photograph (i.e., a surface, spatial position, or defined area) for placement of the building material. Angular orientation of the building material with respect to the building (e.g., side board angular orientation with respect to walls of a house) may be either intelligently generated by the logic element 102 or manually entered by the user, as discussed in greater detail below. That is, for certain building materials (particularly those having a repetitive pattern, e.g., wood siding) a user can select whether the pattern of the building material should extend vertically, horizontally, or at an angle therebetween. The user can later redefine the angular orientation of the building material in order to visualize different patterns and relative constructions of the same building material.

In a particular embodiment, the user may select a fastening parameter (block 306) specifying attachment or material anchoring protocol for attaching the building material to the building. For example, selection of threaded or nonthreaded fasteners, material overlap, clamps, crimped surface finishes, or any other suitable attachment protocol may be visually observable upon rendering. Certain attachment protocol result in visible nail heads, exposed clamps, and observable joints. Moreover, certain attachment protocol may require different spacing, patterning, or overall design, which may be visually observable. Thus, selection of the fastening parameter may permit more accurate observation of the building material on the building.

Upon selection of the one or more building materials and a suitable region of the photograph for rendering of the building material onto the building, the logic element 102 may generate a rendered image (block 308) including the building material aligned with the selected region of the building. At completion of rendering (block 308), the rendered image may be considered neutral. That is, the rendered image may have neutral parameters relating to color, shadowing, luminance intensity, light type (i.e., artificial or natural), light type ratio (i.e., a ratio of artificial light to natural light), building material pattern size, other similar parameters, or any combination thereof. As used herein, "neutral parameters" refer to starting thresholds from which visual parameters of the rendered image may be altered. For example, the luminance of the rendered image may be between, such as exactly between, black and white. More specifically, the "neutral parameter" of the rendered image may be such that a user can adjust the parameter in either an increasing or decreasing direction to visualize the rendered image with either more or less of that parameter. The user may then adjust one or more of the parameters from neutral to visualize the building material in various different environmental conditions (block 310). For example, the user may increase or decrease the lighting intensity to accurately visualize naturally changing daylight conditions such as those conditions encountered at dawn, midday, dusk, or evening. Additionally, the user may adjust one or more light angularity conditions to accurately visualize the building material at different light source angles. For example, the user may accurately visualize the visual properties of the building material on the building when the sun is along the horizon or directly overhead. The user may also select from a variety of a light diffusion settings adjusting for environmental conditions such as haze, cloud coverage, fog, rain, and foliage cover.

In an embodiment, the user may select from a list of predetermined environmental conditions. For example, one or more switches or sliding scales may have preset variables from which a user can select from. Exemplary preset environmental variables include "sunny," "raining," "cloudy," "foggy," or even "snowing." In a further embodiment, the user can set the conditions to change, e.g., from sunny to cloudy, to visualize the changing conditions on the building material.

After adjusting these parameters from neutral to a desired level, the logic element 102 may again render at least a portion of the rendered image having a parameter that reflects the selected parameters (block 312). The user may then optionally capture or otherwise memorialize the rendered image for later inspection and comparison. The process may be repeated one or more times, allowing the user to comparatively visualize different building materials on the building under different or the same environmental conditions.

Figure 4:
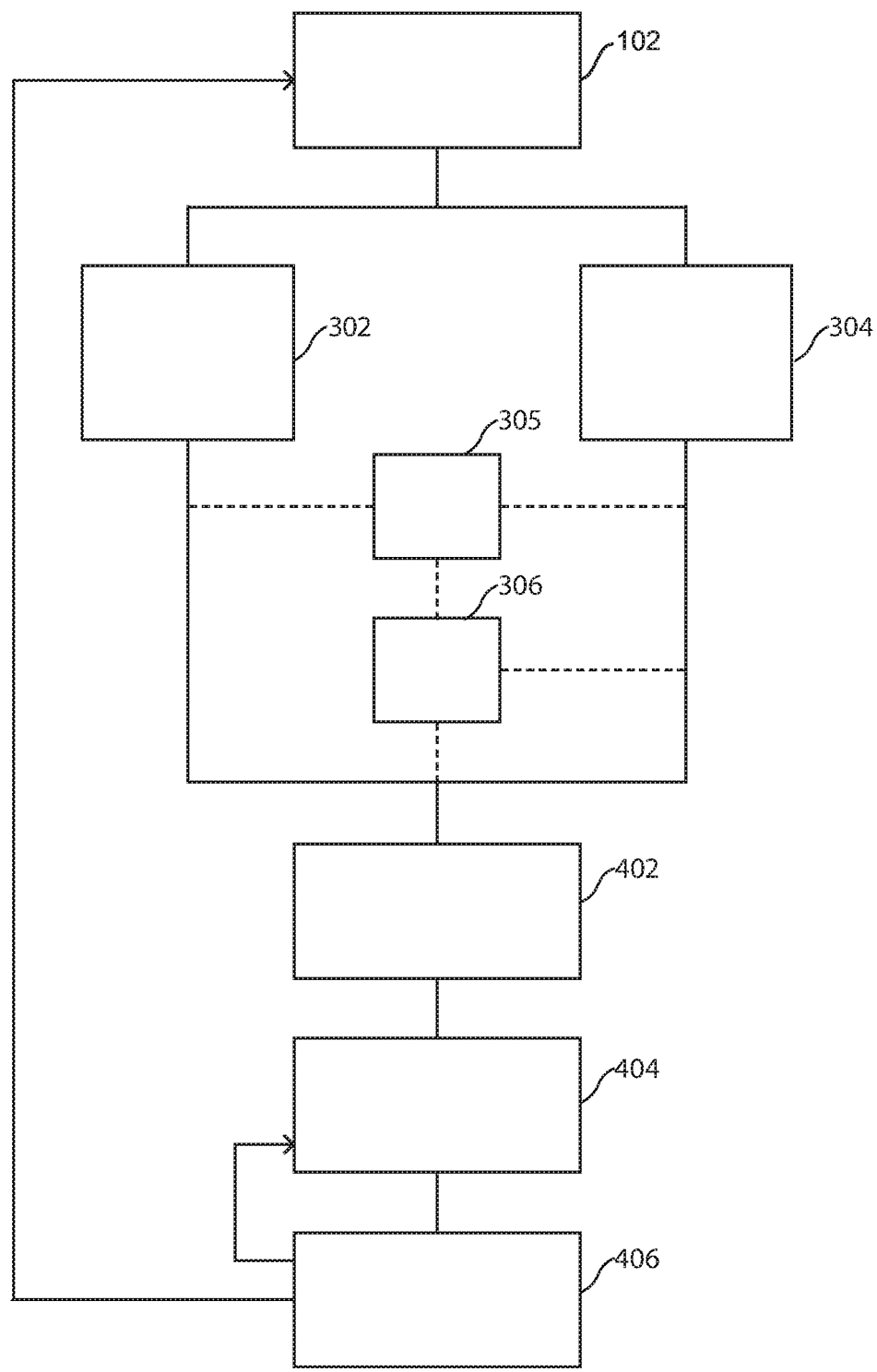
FIG. 4 includes a flowchart of another embodiment for rendering a building material onto a building for visual inspection FIG. 5 includes an illustration of multiple panel viewing of rendered images in accordance with an embodiment.

In another embodiment, illustrated in FIG. 4, selection of the one or more parameters (block 402), described above in block 310, may occur prior to rendering (block 404), as described in block 308 above. For example, the user may increase or decrease the lighting intensity to accurately visualize naturally changing daylight conditions such as those conditions encountered at dawn, midday, dusk, or evening. Additionally, the user may adjust one or more light angularity conditions to accurately visualize the building material at different light source angles. For example, the user may accurately visualize the visual properties of the building material on the building when the sun is along the horizon or directly overhead. The user may also select from a variety of a light diffusion settings adjusting for environmental conditions such as haze, cloud coverage, fog, rain, and foliage cover. In another embodiment, the user may select from a list of predetermined environmental conditions. For example, one or more toggled switches or sliding scales may have preset variables which a user can select from. Exemplary preset variables include "sunny," "raining," "cloudy," "foggy," or even "snowing." In a further embodiment, the user can set the conditions to change, e.g., from sunny to cloudy, to visualize the affect of changing conditions on the building material. After adjusting these parameters to a desired level, the logic element 102 may generate a rendering of the building material on the building. The process illustrated in FIG. 4 may be particularly useful in systems having low processing power, where rendering requires significant time and the generation of a neutral rendered image (discussed above with respect to FIG. 3) is time prohibitive.

In a particular instance, the process illustrated in FIG. 4 may be repeated, or partially repeated, when a user enters different parameters (block 406) and instructs the logic element 102 to again generate a rendering of the building material on the building. Alternatively, the user may also select different photographs of the building.

Figure 5:
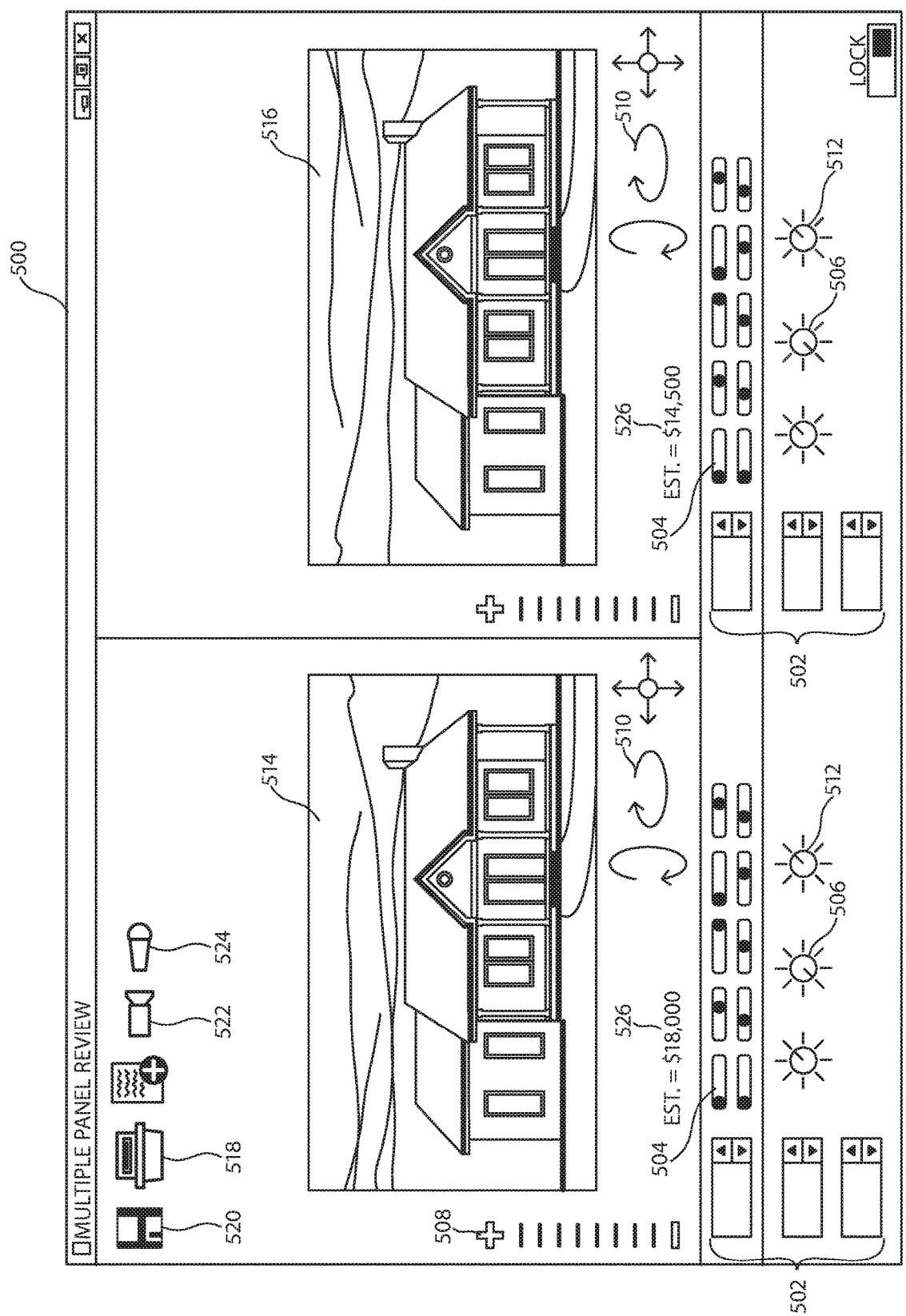

Multiple panel review 500, such as illustrated for example in FIG. 5, may permit simultaneous viewing and comparison of different rendered images (e.g., images 514 and 516), each including different building materials on the same, or different, building, or in different spaces of the same building. In a particular instance, the rendered images displayed in the multiple panels can be simultaneously adjusted through selection and adjustment of one or more of the parameters described above. For example, the user may adjust a luminance parameter (included in one or more selectable toggles or parameter adjustment switches 502) within the interface which simultaneously adjusts the luminance parameter in all rendered images equally. In another instance, the user can selectively adjust each rendered image differently, for example, adjusting the luminance in a first rendered image 504 and adjusting an environmental condition in a second rendered image 506.

In an embodiment, the user can zoom 508, adjust viewing angle 510, move the rendered image, add one or more predefined filters 512, or otherwise manipulate the rendered image. After a desired viewing angle is achieved, the user may optionally memorialize the rendered image, for example, by printing 518 or otherwise suitably generating the rendered image on a substrate, such as a sheet or continuous feed of paper, cardboard, rigid stock, semi-rigid material, or other suitable flexible material. Alternatively, or in addition thereto, the user may save 520 the rendered image on a portable storage device, such as a FLASH system. In an embodiment, the rendered image may also be saved in the storage element 106, or another similar storage device, for later viewing. In yet a further embodiment, the rendered image may be printed via a 3-dimensional printing assembly.

In a particular instance, the rendered image may be converted to a moving picture 522, or video, such that the user can visualize the building material over a continuously adjusted angle or condition. In a first example, the moving picture may include a rendered building material on a building, rotating about an axis or azimuthal orientation. In another example, the moving picture may include a rendered building material on a building, as viewed over an elapsed period of time, e.g., 12 hours, thereby allowing a viewer to visualize a continuously changing environmental condition (luminance intensity, angle, etc.). In yet a further example, the moving picture may include a rendered building material on a building, as viewed over an elapsed period of time and rotating about an axis or azimuthal orientation. The moving picture may be convertible to a known format for storage, comparison, or sharing. As systems with low processing power may require significant time to compile moving pictures, it may be desirable for a user to save the moving picture for future viewing, so as to reduce the number of times rendering operations must be completed.

In an embodiment, the rendered image, or moving picture, may be viewed through 3-dimensional glasses or a screen system permitting 3-dimensional observation of the rendered image. In another embodiment, the memorialized rendered image may be viewed via a holographic projector.

In a particular embodiment, the system 100 may generate audible frequencies 524 which can pertain to the selected building material, thereby permitting the user to discern, for example, the acoustic absorption and reflective properties of the building material. In an embodiment, the user may select from varying intensity environmental conditions (e.g., wind) and observe the acoustic fingerprint of the building material under that condition. Certain materials may better absorb certain frequencies as compared to other materials. For buildings having high wind exposure, it may be helpful, for example, to simulate wind to best select a suitable building material for locations having high wind exposure.

In an embodiment, such as illustrated in FIG. 5, the system may further generate a cost estimate 526 for the user. That is, the system may provide an ongoing cost estimate given the type and amount of specific material being applied to the building.

One advantage of using a system in accordance with an embodiment described herein, is the generation of high-accuracy visual approximation of a building material without requiring manufacturing of samples or other cost-prohibitive demonstrations of the real building material. High accuracy visual approximation may be categorized into at least two components: color accuracy ($\Delta E$) and shadow accuracy.

Color accuracy, $\Delta E$, can be measured according to a Color Test which compares the color of the rendered image to the color of the real material in the same conditions in the calibrated photograph over an area, such as, for example, 1 cm$^2$. The Color Test utilizes the Commission Internationale de l'Eclairage CIE$\Delta$E2000 (L* a* b*) standard defined using the terms of the CIE 1976 definition, comparing rendered color to real color. $\Delta E$ represents the change in color, or color difference, between the rendered image and the calibrated photograph. When compared to the calibrated photograph of the real building material, the rendered image can have a $\Delta E$ of less than 10, less than 9, less than 8, less than 7, less than 6, less than 5, less than 4, less than 3, less than 2, or less than 1.

In an embodiment, a second color accuracy, $\Delta E_2$, can be measured according to a second Color Test which compares the color of the rendered image to the color of the real material as illustrated in the same conditions in a post-processed, calibrated photograph over an area, such as, for example, 1 cm$^2$. Similar to the Color Test, the second Color Test can utilize the Commission Internationale de l'Eclairage CIE$\Delta$E2000 (L* a* b*) standard defined using the terms of the CIE 1976 definition, comparing rendered color to real color. $\Delta E_2$ represents the change in color, or color difference, between the rendered image and the post-processed, calibrated photograph. When compared to the post-processed, calibrated photograph of the real building material, the rendered image can have a $\Delta E_2$ of less than 10, less than 9, less than 8, less than 7, less than 6, less than 5, less than 4, less than 3, less than 2, or less than 1.

Shadow accuracy can be measured according to the Shadow Test which compares shadow fidelity based on parameters such as luminance angle and intensity. Shadows might be formed, for example, by shingle tabs or siding shakes and the relative angle of illumination (e.g., the position of the sun in the sky). The shadows are measured for accuracy of size and luminance over changing illumination conditions, material orientation, and relative viewing angle. When compared to the calibrated photographs, the rendered image can have a shadow accuracy of at least 75%, at least 80%, at least 90%, or even at least 95%. That is, at least 75%, 80%, 90%, or 95% of the shadow size and layout may be accurate to the shadows in the photograph.

In an embodiment, color and shadow accuracy can be measured after completion of the rendering at various sample positions, e.g., at various areas of 1 cm². In a particular aspect, $\Delta E_{AVG}$ is indicative of an average $\Delta E$ as measured at the various sample positions. That is, $\Delta E_{AVG}$ is a measure of average color accuracy according to the Color Test. For example, a first sample position may have a $\Delta E$ of approximately 1, a second sample position may have a $\Delta E$ of approximately 0.7, and a third sample position may have a $\Delta E$ of approximately 0.1. The $\Delta E_{AVG}$ would thus be the sum of the individual $\Delta E$ measurements divided by the number of measurements taken, which in this example is 0.6. The same average can be calculated for shadow accuracy or second color accuracy. That is, average shadow accuracy and average second color accuracy may include an average of multiple shadow accuracy calculations or multiple second color accuracy calculations taken at various sample positions.

In another embodiment, at least one of color accuracy, second color accuracy, and shadow accuracy can be determined by comparing point ensembles between the calibrated photograph or post-processed, calibrated photograph and the rendered image. That is, rather than measure color accuracy, second color accuracy, or shadow accuracy using various sample positions having areas less than the area of the image, it is possible to test $\Delta E$, $\Delta E_2$, or shadow accuracy using one or more clustering techniques, such as those derived from signal processing. By way of a non-limiting example, point ensemble analysis can include the use of k-means, EM clustering, spectral clustering, or any combination thereof to compare the color or shadow point ensemble of the calibrated photograph or post-processed, calibrated photograph to the rendered image.

K-means clustering is a method of partitioning data with numerical vectors, where each numerical vector has dimensionality, M, and there are N such vectors. The value, K, refers to an input parameter that determines the number of partitions to be produced. In general, K-means clustering attempts to find an optimum way to cluster the data into K partitions so as to minimize the average difference between the mean of each cluster (i.e., cluster centroid) and every member of the cluster.

EM clustering, or use of the Expectation-Maximization algorithm, is based on distance computations. EM clustering alternates between an expectation (E) step and a maximization (M) step. The expectation step determines the expectation of a log-likelihood using current estimates for the parameter. Maximization computes parameters maximizing the expected log-likelihood determined during the expectation step. The estimates are then able to determine the distribution of the latent variables in the next expectation set until a clustered model is realized.

Spectral clustering is derived from the use of eigenvalues to perform dimensionality reduction. The primary tools for spectral clustering are graph Laplacian matrices. In a particular instance, spectral clustering can be performed using image segmentation such as the normalized cuts algorithm. Spectral clustering may have several advantages over traditional clustering and algorithmic techniques such as higher performance and simpler calculation protocol.

In an embodiment, the calibrated photograph or post-processed, calibrated photograph can be processed using one or more of the point ensemble methods described above. The rendered image can undergo a similar or same point ensemble method. The resulting cluster distributions can be compared to determine any one of the $\Delta E$, $\Delta E_2$, and shadow accuracy of the rendered image with respect to the calibrated photograph or post-processed, calibrated photograph.

High shadow and color accuracy is important to accurately simulate real building materials for consumer purchase. While traditional systems for visualization of a building material may appear to generate a realistic simulation, such renderings are artistic based and not objectively rendered. That is, the rendered materials do not correspond to actual materials, but rather arbitrary materials devised using non realistic parameters and metrics.

Rendered images generated by the system 100 may further have relative accuracy with respect to each other. For example, two or more rendered images may have a relative color accuracy, dE, with respect to each other where dE, upon changing illumination conditions, material orientation, or viewing angle, is less than 5, less than 4, less than 3, less than 2, or less than 1 as calculated according to CIE$\Delta$E2000 tolerancing. That is, dE defines the difference between $\Delta E$ of two rendered images. By way of a non-limiting example, if a first rendered image has a $\Delta E$ of 1.1 and a second rendered image has a $\Delta E$ of 0.7, the dE of the two images is the difference between 1.1 and 0.7, or 0.4. The two or more rendered images need not be compared at the same environmental conditions (i.e., the same luminance intensity, lamination angle, etc.). Rather, dE is an environmentally independent method of comparing system effectiveness. Whereas a randomly generated rendering (i.e., a rendering not derived from a real building material) may be accurate to a real building material in a real environmental setting with a frequency of 0.001% (for example), a rendered image in accordance with embodiments described herein can be accurate to real building materials with a frequency of at least 90%, at least 95%, at least 96%, at least 97%, at least 98%, or at least 99%. That is, $\Delta E$ is accurate over a wide range of environmental conditions as adjusted by a user in a manner as set forth above.

Relative color accuracy, dE, may further apply for rendered images generated in response to post-processed, calibrated photographs. For example, two or more rendered images may have a second, relative color accuracy, $dE_2$, with respect to each other where $dE_2$, upon changing illumination conditions, material orientation, or viewing angle, is less than 5, less than 4, less than 3, less than 2, or less than 1 as calculated according to CIE$\Delta$E2000 tolerancing. That is, $dE_2$ defines the difference between $\Delta E_2$ of two rendered images. By way of a non-limiting example, if a first rendered image has a $\Delta E_2$ of 1.0 and a second rendered image has a $\Delta E_2$ of 0.9, the $dE_2$ of the two images is the difference between 1.0 and 0.9, or 0.1. The two or more rendered images need not be compared at the same environmental conditions (i.e., the same luminance intensity, lamination angle, etc.). Rather, $dE_2$ is an environmentally independent method of comparing system effectiveness. Whereas a randomly generated rendering (i.e., a rendering not derived from a real building material) may be accurate to a real building material in a real environmental setting with a frequency of 0.001% (for example), a rendered image in accordance with embodiments described herein can be accurate to real building materials with a frequency of at least 90%, at least 95%, at least 96%, at least 97%, at least 98%, or at least 99%. That is, $\Delta E_2$ is accurate over a wide range of environmental conditions as adjusted by a user in a manner as set forth above. It is noted that for many instances, $dE_2$ and $dE$ yield the same results when comparing two images as long as the two images are rendered using the same $\Delta E_2$ (i.e., $\Delta E$ or $\Delta E_2$).

In accordance with an embodiment, a database may be used in conjunction with the system 100 to accurately render building materials in various environmental and physical conditions. The database may include a list of various building materials, defining parameters associated with those building materials. As used herein, parameters of the building material are those elements which describe an attribute of the building material, such as for example, light reflectivity. Each parameter may have several (e.g., 10, 100, 1000, or even 10000) measurements stored within the database. For example, light reflectivity is a single parameter and may include hundreds or even thousands of measurements taken at different locations along the building material.

Figure 6:
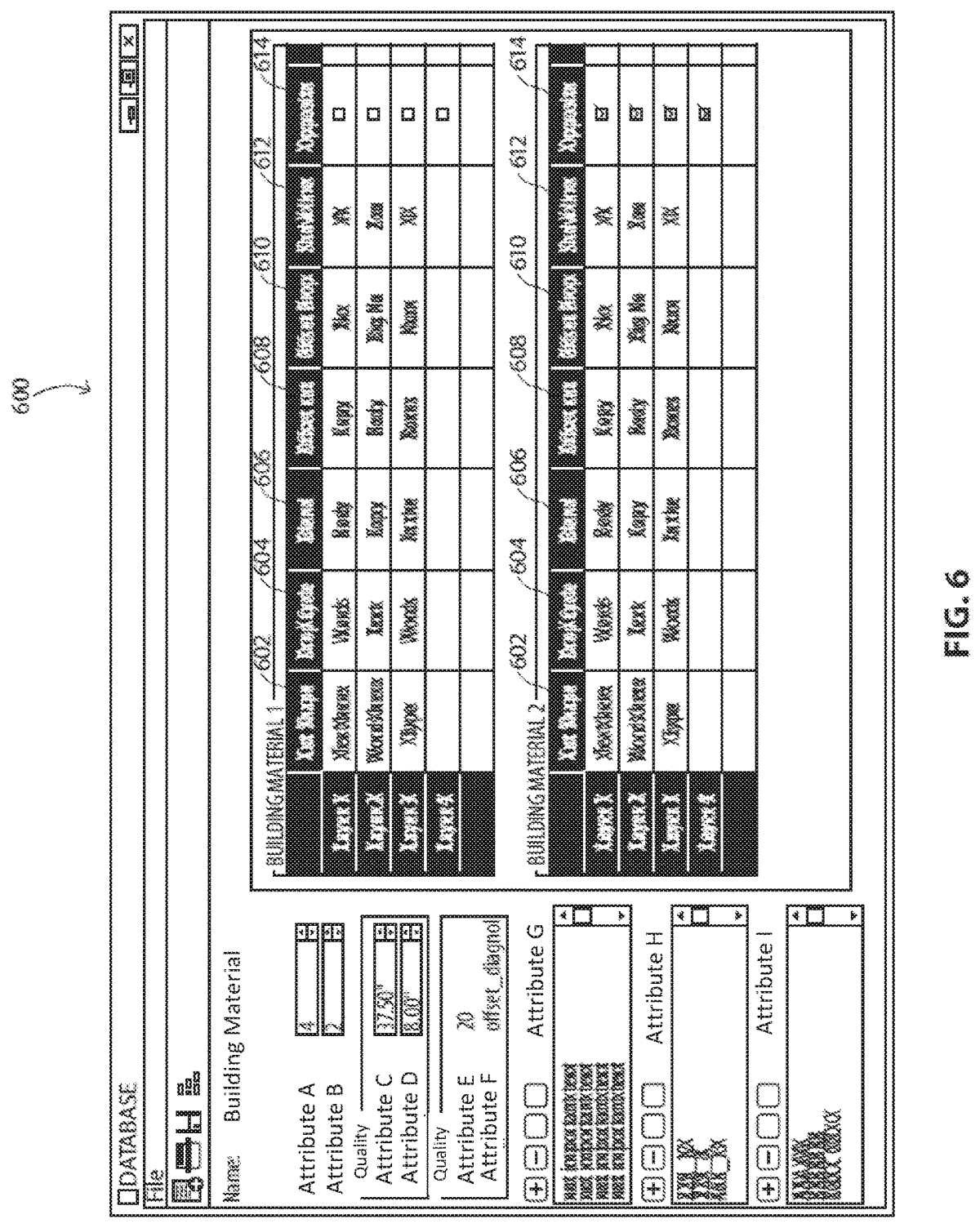

Referring to FIG. 6, and in accordance with an exemplary embodiment, the database 600 can include a first entry 602 defining a first parameter of a building material, such as a building material name. A second entry 604 can define a second parameter of the building material; a third entry 606 can define a third parameter of the building material; a fourth entry 608 can define a fourth parameter of the building material; a fifth entry 610 can define a fifth parameter of the building material; a sixth entry 612 can define a sixth parameter of the building material; a seventh entry 614 can define a seventh parameter of the building material, and so on. The database 600 may include less than seven parameters for at least one building material. For example, the database 600 may include two parameters, three parameters, four parameters, five parameters, six parameters, seven parameters, eight parameters, nine parameters, ten parameters, fifteen parameters, twenty parameters, twenty-five parameters, fifty parameters, or one-hundred parameters. Moreover, the database 600 may include a number of parameters for at least one building material within a range between and including any of the number of parameters listed above, between and including, one parameter and one-hundred parameters. In an embodiment, the database 600 may include no greater than one-hundred thousand parameters, or no greater than ten-thousand parameters.

The parameters can include, for example: a solar reflectance parameter; a near infrared reflectance parameter; a material planarity measurement describing the area of the building material having a planar surface per unit area; macroscopic surface roughness patterning; average surface roughness; relative color within a predefined, controlled environmental setting such as a laboratory setting; a reflection spectra; a chroma; a hue; a luminance; a gloss; a contrast; a material type; a color probability defining the probable color for each granule type of material at every possible location along the building material; a material height or depth (e.g., the height of a shingle at every location); a granules spatial arrangement and light trapping model characteristic; a light scattering property (e.g., parameters of a GGX model), or any other suitable material parameter of the building material. The solar reflectance parameter describes the quantity of solar reflectance of the building material as measured in accordance with ASTM C-1549 procedure or by a solar spectrum reflectometer. Near infrared reflectance (NIR) parameter refers to the reflectance of near infrared range (700 nm to 2500 nm) of the solar spectrum.

Planarity may be measured on a scale of about 0.2 m², about 0.5 m², about 1 m², about 1.7 m², or about 2 m² for one or more substantially planar zones. In an embodiment, the building material on the building can include one or more substantially planar zones, at least one of the zones being substantially planar on a scale of about 0.2 m², about 0.5 m², about 1 m², about 1.7 m², or about 2 m². As used herein, "substantially planar" refers to a two-dimensional characteristic of a surface extending generally along a plane. The term does not limit the zone to being smooth, as the surface may be textured if desired. Planar, or substantially planar, zones of building material may be reflected by area of material in the X- and Y-directions. Planarity may include slight deviations into a Z-direction, perpendicular to the X- and Y-directions. That is, a substantially planar zone may have minimal surface undulation reflected by a portion of that zone extending into the Z-direction. In an embodiment, a zone may be substantially planar when it extends into the Z-direction by 1 inch, 2 inches, or 3 inches. In another embodiment, a zone of the building material may be non-planar when it extends more than 3 inches in the Z-direction. In a particular instance, Z-direction deviation, resulting, for example, from surface undulation may constitute non-planarity when the deviation extends more than 3 inches in the Z-direction.

In particular embodiments, the building material can have a non-white color in the visible spectrum (390 nm to 700 nm). Building materials having a color falling within an inverted conical volume defined by the equation:

$$-(L^*)+K(L^*_O)+(y(a^*)^2+z(b^*)^{0.5})/x \leq 0$$

where $L_O^*=67$, $x=1.05$, $y=1.0$, $z=1.0$, and the values, $L^*$, $a^*$, and $b^*$ are defined on the CIE $L^*a^*b^*$ scale are said to be white and building materials falling outside the inverted conical volume are said to be non-white. Values of the color space corresponding to white within the inverted conical volume close to the vertical $L^*$ axis are not strongly colored and have a relatively high degree of lightness. The white or non-white characteristic of the building material may be quantified and stored in the database 600.

The above described parameters are meant to be exemplary and may further include other properties of the building material—especially those properties which manifest through visual observation.

In an embodiment, user selection of the building material for rendering can automatically include selection of the parameters associated with that building material in the database. In another embodiment, a user can individually select which parameters from the list of parameters associated with the building material are to be used in forming the rendered image. That is, a user can selectively eliminate certain parameters when generating a rendering. This may be particularly helpful during the design and fabrication of new building materials. More specifically, this may permit creation of new building materials by permitting selective adjustment of individual parameters from existing building materials and allowing the user to immediately render the newly generated product without the need to physically create a sample. Alternatively, newly conceptualized building materials can be manually generated by assigning values to each parameter in the database 500.

In one particular instance, new building materials generated using systems in accordance with embodiments described herein may be custom designed by a manufacturer to increase product diversity. In another particular instance, new building materials generated using systems in accordance with embodiments described herein may be custom designed by a customer of a manufacturer. That is, the customer may adjust the parameters and attributes of materials to their particular liking. The customer may then have the option to share the new, custom building material with the manufacturer for manufacturing purposes.

Certain building materials or parameters of the building material may be mutually exclusive and may not be compatible with each other. Optionally, the system 100 may include an indication when certain selected parameters are mutually exclusive and cannot be combined into a single building material. For example, certain materials having a high surface gloss finish may not also be capable of having low near infrared reflectance (NIR). In the instance where a user attempts to generate a material having both high surface gloss finish and low NIR, the system 100 may generate a warning—such as a textual warning, an auditory warning, or another suitable visual warming—that the contemplated building material is not feasible. Alternatively, the system 100 may automatically hide (make unavailable or prevent selection of) mutually exclusive parameters. For example, upon selection of a high surface gloss finish, the NIR parameter may automatically adjust such that a user cannot select low NIR.

In a particular embodiment, parameters of the new, custom designed building material may be stored in the database 500, permitting future users access to the newly designed building material. Additionally, the user interface may include a section, such as for example, a "Recently Created" section, where users may see designs, patterns, and alternate building materials recently generated by other users. Future users may select one or more of the new, custom designed building materials for further modification.

Many different aspects and embodiments are possible. Some of those aspects and embodiments are described below. After reading this specification, skilled artisans will appreciate that those aspects and embodiments are only illustrative and do not limit the scope of the present invention. Embodiments may be in accordance with any one or more of the embodiments as listed below.

Embodiment 1

A system for visualization of a building material on a building, the system adapted to provide a rendered image having a $\Delta E$, as measured according to a Color Test, of less than 10, less than 8, less than 6, less than 5, less than 4, less than 3, less than 2, or even less than 1.

Embodiment 2

A system for visualization of a building material on a building, the system adapted to provide a rendered image having a shadow accuracy, as measured according to a Shadowing Test, of at least 75%, at least 80%, at least 90%, or even at least 95%.

Embodiment 3

A system for visualization of a building material on a building, the system adapted to provide at least two rendered images under different illumination conditions, wherein the at least two rendered images have a relative dE, as measured by a comparison of the $\Delta E$ of each of the at least two rendered images, each as measured according to a Color Test, of less than 8, 7, 6, 5, 4, 3, 2, or 1.

Embodiment 4

A system for visualization of a building material on a building, the system adapted to provide at least two rendered images under different illumination conditions, wherein the at least two rendered images have a relative difference in shadow accuracy, as measured by a comparison of the shadow accuracy of each of the at least two rendered images, each as measured according to a Shadowing Test, of less than 10, 9, 8, 7, 6, 5, 4, 3, 2, or 1.

Embodiment 5

A system for visualization of a building material on a building, the system comprising:
   a logic element adapted to:
      receive data associated with the building material and the building; and
      generate a rendered image of the building material on the building, generation of the rendered image comprising:
         adjusting a parameter of the rendered image using an environmental factor; and
   a user interface adapted to display the rendered image to a user,
   wherein the rendered image has a dE, as measured according to the Color Test, of less than 10, a shadow accuracy, as measured according to the Shadowing Test, of at least 75%, or a combination thereof.

Embodiment 6

A system for visualization of a building material on a building, the system comprising:
   a logic element adapted to:
   receive data associated with the building material and the building; and
   generate a rendered image of the building material on the building, generation of the rendered image comprising:
      adjusting a parameter of the rendered image using an environmental factor; and a user interface adapted to display the rendered image to a user,
   wherein the user can selectively adjust the environmental factor while maintaining a dE, as measured according to the Color Test, of less than 10 and a shadow accuracy, as measured according to the Shadowing Test, of at least 75%, and wherein the environmental factor includes: an illumination intensity, a relative illumination angle, an illumination color, a weather factor, a time of day, a shading factor, a global longitude, a global latitude, a vertical orientation factor, or any combination thereof.

Embodiment 7

A rendered image having:
   a $\Delta E$, as measured according to a Color Test, of less than 10, less than 8, less than 6, less than 5, less than 4, less than 3, less than 2, or even less than 1;

a shadow accuracy, as measured according to a Shadowing Test, of at least 75%, at least 80%, at least 90%, or even at least 95%; or a combination thereof.

Embodiment 8

At least two rendered images having:
a relative dE, as measured by a comparison of the ΔE of each of the at least two rendered images, each as measured according to a Color Test, of less than 8, 7, 6, 5, 4, 3, 2, or 1;
a relative difference in shadow accuracy, as measured by a comparison of the shadow accuracy of each of the at least two rendered images, each as measured according to a Shadowing Test, of at least 75%, at least 80%, at least 90%, or even at least 95%; or
a combination thereof.

Embodiment 9

A method of visualizing a building material on a building comprising:
providing logic and memory storage elements, the memory storage element storing data associated with the building material;
sending data associated with the building material and the building to the logic element; and
the logic element receiving the data and generating a rendered image of the building material on the building, wherein the rendered image has a dE, as measured according to the Color Test, of less than 10, a shadow accuracy, as measured according to the Shadowing Test, of at least 75%, or a combination thereof.

Embodiment 10

A system for visualization of a building material on a building, the system adapted to provide a rendered image having a $\Delta E_2$, as measured according to a second Color Test, of less than 10, less than 8, less than 6, less than 5, less than 4, less than 3, less than 2, or even less than 1.

Embodiment 11

A rendered image having:
a $\Delta E_2$, as measured according to a second Color Test, of less than 10, less than 8, less than 6, less than 5, less than 4, less than 3, less than 2, or even less than 1;
a shadow accuracy, as measured according to a Shadowing Test, of at least 75%, at least 80%, at least 90%, or even at least 95%; or
a combination thereof.

Embodiment 12

A method of visualizing a building material on a building comprising:
providing logic and memory storage elements, the memory storage element storing data associated with the building material;
sending data associated with the building material and the building to the logic element; and
the logic element receiving the data and generating a rendered image of the building material on the building, wherein the rendered image has a $dE_2$, as measured according to a second Color Test, of less than 10, a shadow accuracy, as measured according to the Shadowing Test, of at least 75%, or a combination thereof

Embodiment 13

The method of embodiment 9, further comprising:
selectively adjusting a parameter of the rendered image using an environmental factor,
wherein the parameter is adjusted while maintaining a dE, as measured according to the Color Test, of less than 10 and a shadow accuracy, as measured according to the Shadowing Test, of at least 75%.

Embodiment 14

The system or method according to any one of the preceding embodiments, further comprising:
a printing device adapted to print the rendered image onto a substrate, such as a paper.

Embodiment 15

The system or method according to any one of the preceding embodiments, wherein the system or method is adapted to provide a rendered image having a dE, as measured according to the Color Test, of less than 10, less than 8, less than 6, less than 5, less than 4, less than 3, less than 2, or even less than 1.

Embodiment 16

The system or method according to any one of the preceding embodiments, wherein the system or method is adapted to provide a rendered image having a shadow accuracy, as measured according to the Shadowing Test, of at least 75%, at least 80%, at least 90%, or even at least 95%.

Embodiment 17

The system or method according to any one of the preceding embodiments, wherein the system or method further comprises a storage element, and wherein the storage element is adapted to store data associated with the building material, the building, or a combination thereof.

Embodiment 18

The system or method according to any one of the preceding embodiments, wherein the data associated with the building material relates to: a solar reflectance parameter; a near infrared reflectance parameter; a material planarity measurement describing the area of the building material having a planar surface per unit area; macroscopic surface roughness patterning; average surface roughness; relative color within a predefined, controlled environmental setting such as a laboratory setting; reflection spectra; chroma; hue; luminance; gloss; contrast; material type; color probability defining the probable color for each granule type of material at every possible location along the building material; a material height or depth; granules spatial arrangement and light trapping model information; light scatting properties.

Embodiment 19

The system or method according to any one of the preceding embodiments, wherein the data associated with the building material is stored in a readable file.

Embodiment 20

The system or method according to any one of the preceding embodiments, wherein the data associated with the building is stored in the storage element.

Embodiment 21

The system or method according to any one of embodiments 1 to 19, wherein the data associated with the building is stored in a secondary storage element.

Embodiment 22

The system or method according to any one of the preceding embodiments, wherein the data associated with the building is generated from a photograph of the building.

Embodiment 23

The system or method according to embodiment 22, wherein the photograph is a calibrated photograph.

Embodiment 24

The system or method according to any one of the preceding embodiments, wherein the storage element is wirelessly connected to the logic element.

Embodiment 25

The system or method according to any one of the preceding embodiments, wherein the storage element is hardwired to the logic element.

Embodiment 26

The system or method according to any one of the preceding embodiments, wherein the system further comprises a user interface.

Embodiment 27

The system or method according to any one of the preceding embodiments, wherein the user interface comprises a monitor.

Embodiment 28

The system or method according to any one of the preceding embodiments, wherein the user interface comprises a mobile communication system.

Embodiment 29

The system or method according to any one of the preceding embodiments, wherein the rendered image is transmitted to the user interface via an HTML protocol.

Embodiment 30

The system or method according to any one of the preceding embodiments, wherein the logic element is disposed at a remote location with respect to the user interface.

Embodiment 31

The system or method according to any one of the preceding embodiments, wherein the rendering is performed at a remote location with respect to the user interface, and wherein the rendered image is transmitted to the user interface.

Embodiment 32

The system or method according to any one of the preceding embodiments, wherein a parameter of the rendered image can be adjusted using an environmental factor.

Embodiment 33

The system or method according to any one of the preceding embodiments, wherein the system is adapted to utilize a global position of the building to determine a range of environmental factors.

Embodiment 34

The system or method according to any one of the preceding embodiments, wherein the system is adapted to utilize a global position of the building to determine an illumination intensity and a relative illumination angle per time of day and time of year.

Embodiment 35

The system or method according to any one of embodiments 33 and 34, wherein the global position is determined by a geolocation element and wherein the global position is sent to the logic element.

Embodiment 36

The system or method according to any one of embodiments 33 and 34, wherein the global position is manually entered into the logic element.

Embodiment 37

The system or method according to any one of the preceding embodiments, wherein the logic element is adapted to provide the user with an estimated cost of the building material in the rendered image.

Embodiment 38

The system or method according to any one of the preceding embodiments, wherein the environmental factor is adjustable by the user through one or more adjustable buttons at the user interface.

Embodiment 39

The system or method according to any one of the preceding embodiments, wherein the environmental factor is adjustable by the user through one or more digital buttons on the user interface.

Embodiment 40

The system or method according to any one of the preceding embodiments, wherein the system is adapted to store previously viewed rendered images and an associated metadata, and wherein a user can access the previously viewed rendered images and the associated metadata.

Embodiment 41

The system or method according to embodiment 18, wherein the building material has a solar reflectance of greater than about 24%, greater than about 29%, greater than about 35%, greater than about 41%, or greater than about 49%.

Embodiment 42

The system or method according to embodiment 18, wherein the building material has a near infrared reflectance of greater than about 24%, greater than about 29%, greater than about 35%, greater than about 41%, or greater than about 49%.

Embodiment 43

The system or method according to one of embodiments 38 or 39, wherein the building material has a non-white color in the visible spectrum.

Embodiment 44

The system or method according to any one of the preceding embodiments, wherein the building material comprises one or more substantially planar zones, at least one of the zones being substantially planar on a scale of about 0.2 m$^2$, about 0.5 m$^2$, about 1 m$^2$, about 1.7 m$^2$, or about 2 m$^2$.

Embodiment 45

The system or method according to any one of the preceding embodiments, wherein the building material on the building comprises one or more substantially planar zones, at least one of the zones being substantially planar on a scale of about 0.2 m$^2$, about 0.5 m$^2$, about 1 m$^2$, about 1.7 m$^2$, or about 2 m$^2$.

Embodiment 46

The system or method according to any one of the preceding embodiments, wherein the system further comprises an audio component adapted to generate audible frequencies.

Embodiment 47

The system or method according to embodiment 46, wherein the audible frequencies correspond to an acoustic fingerprint of the building material upon introduction to an environmental stimulus.

Note that not all of the features described above are required, that a portion of a specific feature may not be required, and that one or more features may be provided in addition to those described. Still further, the order in which features are described is not necessarily the order in which the features are installed.

Certain features are, for clarity, described herein in the context of separate embodiments, may also be provided in combination in a single embodiment. Conversely, various features that are, for brevity, described in the context of a single embodiment, may also be provided separately or in any subcombinations.

Benefits, other advantages, and solutions to problems have been described above with regard to specific embodiments, However, the benefits, advantages, solutions to problems, and any feature(s) that may cause any benefit, advantage, or solution to occur or become more pronounced are not to be construed as a critical, required, or essential feature of any or all the claims.

The specification and illustrations of the embodiments described herein are intended to provide a general understanding of the structure of the various embodiments. The specification and illustrations are not intended to serve as an exhaustive and comprehensive description of all of the elements and features of apparatus and systems that use the structures or methods described herein. Separate embodiments may also be provided in combination in a single embodiment, and conversely, various features that are, for brevity, described in the context of a single embodiment, may also be provided separately or in any subcombination. Further, reference to values stated in ranges includes each and every value within that range. Many other embodiments may be apparent to skilled artisans only after reading this specification. Other embodiments may be used and derived from the disclosure, such that a structural substitution, logical substitution, or any change may be made without departing from the scope of the disclosure. Accordingly, the disclosure is to be regarded as illustrative rather than restrictive.

The invention claimed is:

1. A method of visualizing a building material, comprising:
    selecting the building material from a database;
    selecting a masked surface on a color calibrated photograph of a building displayed on a user interface;
    generating a rendered image showing the selected building material on the selected masked surface of the color calibrated photograph of the building; and
    displaying the rendered image on the user interface, wherein the rendered image has a color accuracy, ΔE, as measured according to a Color Test, of less than 10, wherein the rendered image has a shadow accuracy, as measured according to a Shadowing Test, of at least 75%, and wherein the Shadowing Test compares a shadow fidelity of the rendered image to the color calibrated photograph at least partially based on luminance angle and intensity.

2. The method of claim 1, wherein the rendered image has a color accuracy, ΔE, of less than 8.

3. The method of claim 1, wherein the rendered image has a shadow accuracy of at least 80%.

4. The method of claim 1, further comprising: storing data associated with the building material, the building, or a combination thereof.

5. The method of claim 4, wherein the data associated with the building material relates to at least one of: a solar reflectance parameter; a near infrared reflectance parameter;

a material planarity measurement describing the area of the building material having a planar surface per unit area; macroscopic surface roughness patterning; average surface roughness; relative color within a predefined, controlled environmental setting such as a laboratory setting; reflection spectra; chroma; hue; luminance; gloss; contrast; material type; color probability defining the probable color for each granule type of material at every possible location along the building material; a material height or depth; granules spatial arrangement and light trapping model information; and light scatting properties.

6. The method of claim 4, wherein the data associated with the building is generated from the color calibrated photograph of the building.

7. The method of claim 1, wherein the color calibrated photograph of the building is calibrated using standard color targets.

8. A method of visualization of a building material on a building, comprising:
   selecting the building material from a database;
   selecting a masked surface on a color calibrated photograph of the building displayed on a user interface; and
   generating a rendered image showing the selected building material on the selected masked surface of the color calibrated photograph of the building by adjusting a parameter of the rendered image using an environmental factor; and
   displaying the rendered image to a user on the user interface, wherein the rendered image has a color accuracy, $\Delta E$, as measured according to a Color Test, of less than 10, a shadow accuracy, as measured according to a Shadowing Test, of at least 75%, or a combination thereof, and wherein the Shadowing Test compares a shadow fidelity of the rendered image to the color calibrated photograph of the building at least partially based on luminance angle and intensity.

9. The method of claim 8, further comprising: measuring one or more rendered shadows for accuracy of size and luminance over changing illumination conditions, material orientation, and relative viewing angle.

10. The method of claim 8, wherein $\Delta E$ is less than 8, less than 6, less than 5, less than 4, less than 3, less than 2, or even less than 1.

11. The method of claim 8, wherein the rendered image has a shadow accuracy of at least 80%, at least 90%, or even at least 95%.

12. The method of claim 8, further comprising: providing at least two rendered images under different illumination conditions, wherein the at least two rendered images have a relative color accuracy, dE, as measured by a comparison of the $\Delta E$ of each of the at least two rendered images, each as measured according to the Color Test, of less than 8, 7, 6, 5, 4, 3, 2, or 1.

13. The method of claim 8, further comprising: providing at least two rendered images under different illumination conditions, wherein the at least two rendered images have a relative difference in shadow accuracy, as measured by a comparison of the shadow accuracy of each of the at least two rendered images, each as measured according to the Shadowing Test, of less than 10, 9, 8, 7, 6, 5, 4, 3, 2, or 1.

14. A method of visualizing a building material on a building, comprising:
   providing a user interface, a logic element operatively connected to the user interface, and a memory storage element connected in communication with the logic element, wherein the memory storage element stores data associated with the building material;
   selecting the building material;
   selecting a masked surface on a building displayed on the user interface;
   sending data associated with the selected building material and the building to the logic element;
   the logic element receiving the data and generating a rendered image showing the selected building material on the selected masked surface of the building, wherein the rendered image has a color accuracy, $\Delta E$, as measured according to the Color Test, of less than 10, a shadow accuracy, as measured according to the Shadowing Test, of at least 75%, or a combination thereof; and
   displaying the rendered image on the user interface.

15. The method of claim 14, further comprising: selectively adjusting a parameter of the rendered image using an environmental factor.

16. The method of claim 14, further comprising: printing the rendered image onto a substrate.

17. The method of claim 14, further comprising: storing data associated with the building material, the building, or a combination thereof.

18. The method of claim 17, wherein the data associated with the building material is stored in a readable file.

19. The method of claim 17, wherein the data associated with the building is generated from a photograph of the building.

20. The method of claim 19, wherein the photograph of the building is a calibrated photograph.

* * * * *